US012628496B2

(12) United States Patent
Yun et al.

(10) Patent No.: US 12,628,496 B2
(45) Date of Patent: May 12, 2026

(54) DISPLAY APPARATUS HAVING A LIGHT-EMITTING LAYER

(71) Applicant: LG Display Co., Ltd., Seoul (KR)

(72) Inventors: Hui Kun Yun, Gimpo-si (KR); Wook Song, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 374 days.

(21) Appl. No.: 17/552,112

(22) Filed: Dec. 15, 2021

(65) Prior Publication Data

US 2022/0209155 A1 Jun. 30, 2022

(30) Foreign Application Priority Data

Dec. 31, 2020 (KR) ........................ 10-2020-0189744

(51) Int. Cl.
*H10K 30/80* (2023.01)
*H10K 50/11* (2023.01)
(Continued)

(52) U.S. Cl.
CPC ........... *H10K 50/19* (2023.02); *H10K 30/865* (2023.02); *H10K 50/11* (2023.02); *H10K 50/131* (2023.02); *H10K 2101/10* (2023.02)

(58) Field of Classification Search
CPC ...... H10K 50/131; H10K 50/11; H10K 50/19; H10K 2101/10; H10K 50/125;
(Continued)

(56) References Cited

U.S. PATENT DOCUMENTS 6,392,250 B1 * 5/2002 Aziz .................... H10K 50/125 257/144
6,541,909 B1 * 4/2003 Motomatsu ............ H10K 50/14 313/506
(Continued)

FOREIGN PATENT DOCUMENTS

KR 10-2008-0043180 A 5/2008
KR 101450881 B1 * 10/2014
(Continued)

OTHER PUBLICATIONS

Office Action issued on May 13, 2024 in Korean Patent Application No. 10-2020-0189744.
(Continued)

*Primary Examiner* — Matthew C Landau
*Assistant Examiner* — David W Ward
(74) *Attorney, Agent, or Firm* — Morgan, Lewis & Bockius LLP

(57) ABSTRACT

A display apparatus including a light-emitting layer is provided. The light-emitting layer may be disposed between a first electrode and a second electrode. The light-emitting layer may include a first emission stack and a second emission stack on the first emission stack. The first emission stack may include a blue emission material layer. The second emission stack may include an emission buffer layer, a first phosphorescent emission material layer and a second phosphorescent emission material layer, which are sequentially stacked. The emission buffer layer may include a host having an electron transporting properties and a red dopant. The content of the red dopant in the emission buffer layer may decrease as a distance from the first charge generation layer increases. Thus, in the display apparatus, a color change at low-current may be improved.

14 Claims, 3 Drawing Sheets

(51) Int. Cl.

| | |
|---|---|
| ***H10K 50/13*** | (2023.01) |
| ***H10K 50/19*** | (2023.01) |
| *H10K 101/10* | (2023.01) |

(58) Field of Classification Search

CPC .. H10K 2102/351; H10K 50/14; H10K 50/15; H10K 50/16; H10K 50/135; H10K 2101/80; H10K 50/12; H10K 50/121; H10K 50/01; H10K 30/84–865; H10K 2101/27

See application file for complete search history.

(56) References Cited

U.S. PATENT DOCUMENTS

| | | | | |
|---|---|---|---|---|
| 2003/0068524 | A1* | 4/2003 | Hatwar | H10K 50/11 428/917 |
| 2005/0046337 | A1* | 3/2005 | Chin | H10K 10/00 313/504 |
| 2006/0188746 | A1* | 8/2006 | Iou | H10K 50/11 257/101 |
| 2007/0194701 | A1* | 8/2007 | Ito | H05B 33/14 428/917 |
| 2008/0111480 | A1 | 5/2008 | Lee et al. | |
| 2014/0284566 | A1* | 9/2014 | Yoo | H10K 50/852 257/89 |
| 2016/0149151 | A1* | 5/2016 | Kam | H10K 50/13 257/40 |
| 2016/0240801 | A1* | 8/2016 | Chang | H10K 77/111 |
| 2017/0186821 | A1 | 6/2017 | Yoo et al. | |
| 2017/0352829 | A1* | 12/2017 | Seo | H10K 85/636 |
| 2019/0165292 | A1* | 5/2019 | Hong | H10K 50/15 |
| 2021/0151691 | A1* | 5/2021 | Yoon | H10K 85/346 |

FOREIGN PATENT DOCUMENTS

| | | | | |
|---|---|---|---|---|
| KR | 10-2016-0074376 A | | 6/2016 | |
| KR | 10-2017-0076218 A | | 7/2017 | |
| KR | 10-2019-0024398 A | | 3/2019 | |
| KR | 20190024398 A | * | 3/2019 | H01L 51/5072 |

OTHER PUBLICATIONS

Office Action issued on Jan. 15, 2025 in Korean Patent Application No. 10-2020-0189744 Note: KR10-2019-0024398A and KR10-2016-0074376A cited therein are already of record.

Office Action issued on Jun. 21, 2025 in Chinese Patent Application No. 202111554521.8 (Note: US2008111480A1, KR20190024398A, and US2016149151A1 cited therein are already of record.).

* cited by examiner

DISPLAY APPARATUS HAVING A LIGHT-EMITTING LAYER

CROSS-REFERENCE TO RELATED APPLICATIONS

This application claims the benefit of Korean Patent Application No. 10-2020-0189744 filed on Dec. 31, 2020, which is hereby incorporated by reference as if fully set forth herein.

BACKGROUND

Technical Field

The present disclosure relates to a display apparatus realizing an image by light emitted from a light-emitting layer.

Discussion of the Related Art

Generally, an electronic appliance, such as a monitor, a TV, a laptop computer and a digital camera, includes a display apparatus to realize an image. For example, the display apparatus may include at least one light-emitting device. The light-emitting device may emit light displaying a specific color. For example, the light-emitting device may include a light-emitting layer disposed between two electrodes.

The light-emitting device may emit the light display a white color. The light-emitting layer may be composed of a plurality of emission material layers (EML). For example, in the display apparatus, the light-emitting layer between a first electrode and a second electrode may include a charge generation layer between a first emission stack and a second emission stack. The first emission stack may include a blue emission material layer. The second emission stack may include a red phosphorescent emission material layer and a green phosphorescent emission material layer, which are sequentially stacked on the charge generation layer. However, since the inflow of holes to the red phosphorescent emission material layer from the charge generation layer is difficult, a driving voltage of the display apparatus may increase. And, when the driving voltage in the display apparatus is reduced by relieving the energy level difference between the charge generation layer and the red phosphorescent emission material layer, it is difficult to adjust the color at low-current due to the rapid movement of the holes.

SUMMARY

Accordingly, embodiments of the present disclosure are directed to a display apparatus that substantially obviates one or more problems due to limitations and disadvantages of the related art.

An aspect of the present disclosure is to provide a display apparatus capable of reducing the driving current and improving the change of the color at the low-current.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a display apparatus comprises a first electrode; a second electrode disposed on the first electrode; a first charge generation layer disposed between the first electrode and the second electrode; a first emission stack disposed between the first electrode and the first charge generation layer, the first emission stack including a blue emission material layer; and a second emission stack disposed between the first charge generation layer and the second electrode. The second emission stack includes an emission buffer layer, a first phosphorescent emission material layer and a second phosphorescent emission material layer, which are sequentially stacked. The first phosphorescent emission material layer includes a red dopant. The emission buffer layer includes a host having an electron transporting properties in which a red dopant is doped. The content of the red dopant in the emission buffer layer decreases as a distance from the first charge generation layer increases.

The first charge generation layer may include a n-type charge generation layer and a p-type charge generation layer on the n-type charge generation layer. The n-type charge generation layer may be disposed close to the first emission stack. The emission buffer layer may be in contact with the p-type charge generation layer and the first phosphorescent emission material layer.

The red dopant of the emission buffer layer may include a phosphorescent material.

The red dopant of the emission buffer layer may include one of Ir(Piq)3(Tris(1-phenylisoquinoline)iridium(III)), Ir(piq)2(acac) (Bis(1-phenylisoquinoline) (acetylacetonate) iridiumIII)), Ir(btp)2(acac) (Bis)2-benzo[b]thiophen-2-yl-pyridine)(acetylacetonate)iridiumIII)), Ir(BT)2(acac) (Bis(2-phenylbenzothazolato)(acetylacetonate)iridiumIII)).

The red dopant of the first phosphorescent emission material layer may include the same material as the red dopant of the emission buffer layer.

The content of the red dopant at a surface of the emission buffer layer being in contact with the first phosphorescent emission material layer may be the same as the content of the red dopant in the first phosphorescent emission material layer.

A host of the first phosphorescent emission material layer may include the same as the host of the emission buffer layer having the electron transporting properties.

The host having the electron transporting properties may include benzo-carbazole.

A third emission stack may be disposed between the second emission stack and the second electrode. The second charge generation layer may be disposed between the second emission stack and the third emission stack. The third emission stack may include a blue emission material layer.

The blue emission material layer of the third emission stack may include the same material as the blue emission material layer of the first emission stack.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1:
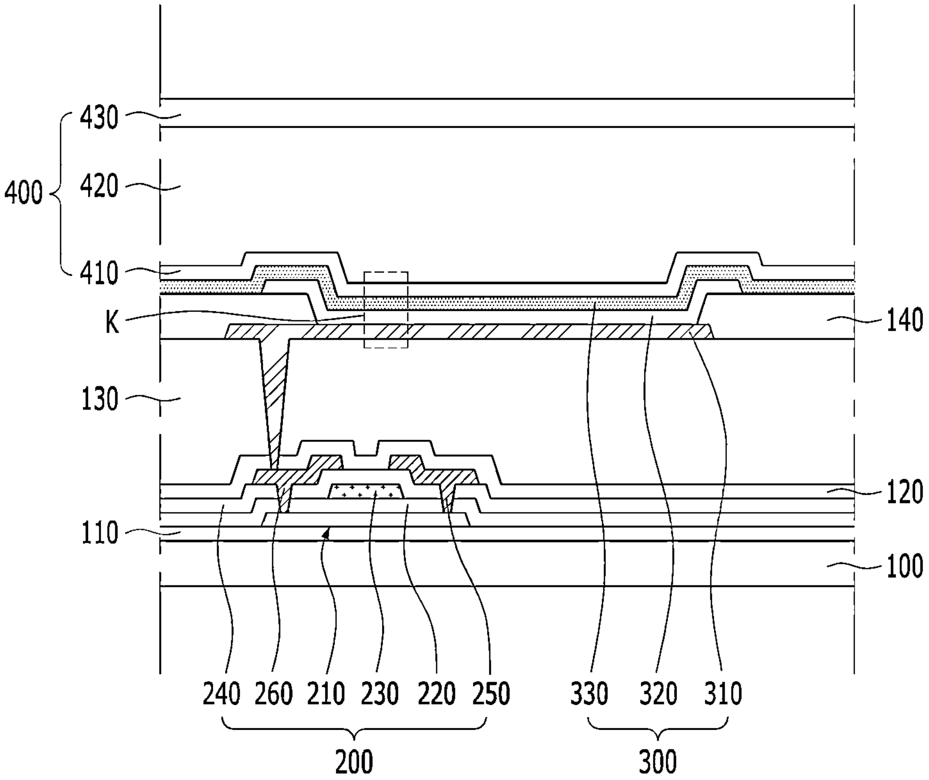
FIG. 1 is a view schematically showing a display apparatus according to an embodiment of the present disclosure.

Hereinafter, details related to the above objects, technical configurations, and operational effects of the embodiments of the present disclosure will be clearly understood by the following detailed description with reference to the drawings, which illustrate some embodiments of the present disclosure. Here, the embodiments of the present disclosure are provided in order to allow the technical sprit of the present disclosure to be satisfactorily transferred to those skilled in the art, and thus the present disclosure may be embodied in other forms and is not limited to the embodiments described below.

In addition, the same or extremely similar elements may be designated by the same reference numerals throughout the specification, and in the drawings, the lengths and thickness of layers and regions may be exaggerated for convenience. It will be understood that, when a first element is referred to as being "on" a second element, although the first element may be disposed on the second element so as to come into contact with the second element, a third element may be interposed between the first element and the second element.

Here, terms such as, for example, "first" and "second" may be used to distinguish any one element with another element. However, the first element and the second element may be arbitrary named according to the convenience of those skilled in the art without departing the technical sprit of the present disclosure.

The terms used in the specification of the present disclosure are merely used in order to describe particular embodiments, and are not intended to limit the scope of the present disclosure. For example, an element described in the singular form is intended to include a plurality of elements unless the context clearly indicates otherwise. In addition, in the specification of the present disclosure, it will be further understood that the terms "comprise" and "include" specify the presence of stated features, integers, steps, operations, elements, components, and/or combinations thereof, but do not preclude the presence or addition of one or more other features, integers, steps, operations, elements, components, and/or combinations.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Embodiment

Figure 2:
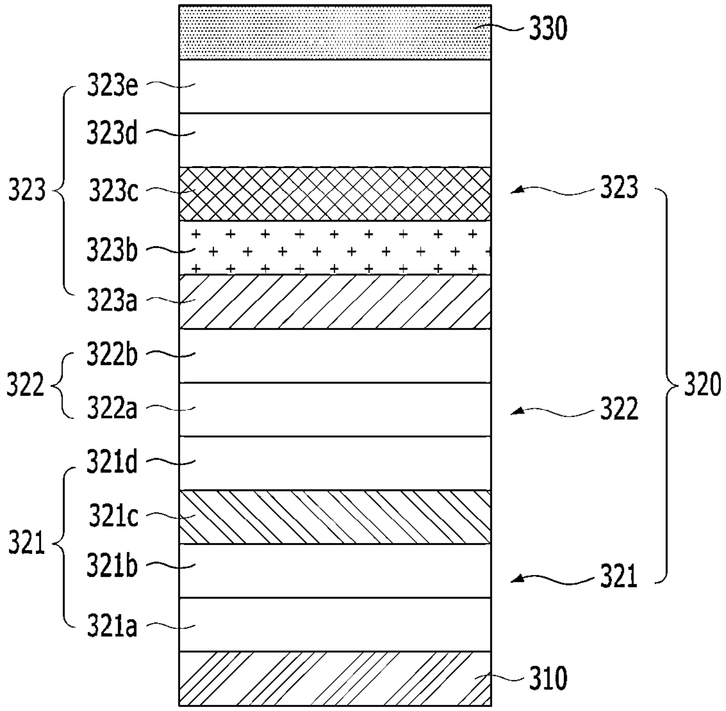
FIG. 2 is an enlarged view of K region in FIG. 1.

FIG. 1 is a view schematically showing a display apparatus according to an embodiment of the present disclosure. FIG. 2 is an enlarged view of K region in FIG. 1.

Referring to FIGS. 1 and 2, the display apparatus according to the embodiment of the present disclosure may include a device substrate 100. The device substrate 100 may include an insulating material. For example, the device substrate 100 may include glass or plastic.

A driving circuit may be disposed on the device substrate 100. The driving circuit may generate a driving current corresponding to a data signal according to a gate signal. For example, the driving circuit may include at least one thin film transistor 200. The thin film transistor 200 may include a semiconductor pattern 210, a gate insulating layer 220, a gate electrode 230, an interlayer insulating layer 240, a source electrode 250 and a drain electrode 260.

The semiconductor pattern 210 may include a semiconductor material. For example, the semiconductor pattern 210 may include amorphous silicon (a-Si) or polycrystalline silicon (poly-Si). The semiconductor pattern 210 may be an oxide semiconductor. For example, the semiconductor pattern 210 may include a metal oxide, such as IGZO. The semiconductor pattern 210 may include a source region, a drain region and a channel region. The channel region may be disposed between the source region and the drain region. The source region and the drain region may have a resistance lower than the channel region.

The gate insulating layer 220 may be disposed on the semiconductor pattern 210. The gate insulating layer 220 may extend beyond the semiconductor pattern 210. For example, a side of the semiconductor pattern 210 may be covered by the gate insulating layer 220. The gate insulating layer 220 may include an insulating material. For example, the gate insulating layer 220 may include an inorganic insulating material, such as silicon oxide (SiO) and silicon nitride (SiN). The gate insulating layer 220 may include a material having a high dielectric constant. For example, the gate insulating layer 220 may include high-K material, such as hafnium oxide (HfO). The gate insulating layer 220 may have a multi-layer structure.

The gate electrode 230 may be disposed on the gate insulating layer 220. The gate electrode 230 may include a conductive material. For example, the gate electrode 230 may include a metal, such as aluminum (Al), titanium (Ti), copper (Cu), chromium (Cr), molybdenum (Mo) and tungsten (W). The gate electrode 230 may be insulated from the semiconductor pattern 210 by the gate insulating layer 220. The gate electrode 230 may overlap the channel region of the semiconductor pattern 210. For example, the channel region of the semiconductor pattern 210 may have an electrical conductivity corresponding to a voltage applied to the gate electrode 230.

The interlayer insulating layer 240 may be disposed on the gate electrode 230. The interlayer insulating layer 240 may extend the gate electrode 230. For example, a side of the gate electrode 230 may be covered by the interlayer insulating layer 240. The interlayer insulating layer 240 may be in direct contact with the gate insulating layer 220 at the outside of the gate electrode 230. The interlayer insulating layer 240 may include an insulating material. For example, the interlayer insulating layer 240 may include an inorganic insulating material, such as silicon oxide (SiO) and silicon nitride (SiN).

The source electrode 250 may be disposed on the interlayer insulating layer 240. The source electrode 250 may include a conductive material. For example, the source electrode 250 may include a metal, such as aluminum (Al), titanium (Ti), copper (Cu), chrome (Cr), molybdenum (Mo) and tungsten (W). The source electrode 250 may be insulated from the gate electrode 230 by the interlayer insulating layer 240. For example, the source electrode 250 may include a material different from the gate electrode 230. the source electrode 250 may be electrically connected to the source region of the semiconductor pattern 210. For example, the gate insulating layer 220 and the interlayer insulating layer 240 may include a source contact hole partially exposing the source region of the semiconductor pattern 210. The source electrode 250 may include a region overlapping with the source region of the semiconductor pattern 210. For example, the source electrode 250 may be in direct contact with the source region of the semiconductor pattern 210 in the source contact hole.

The drain electrode 260 may be disposed on the interlayer insulating layer 240. The drain electrode 260 may include a conductive material. For example, the drain electrode 260 may include a metal, such as aluminum (Al), titanium (Ti), copper (Cu), chrome (Cr), molybdenum (Mo) and tungsten (W). The drain electrode 260 may be insulated from the gate electrode 230 by the interlayer insulating layer 240. For example, the drain electrode 260 may include a material different from the gate electrode 230. The drain electrode 260 may include the same material as the source electrode 250. The drain electrode 260 may be electrically connected to the drain region of the semiconductor pattern 210. The drain electrode 260 may be spaced away from the source electrode 250. For example, the gate insulating layer 220 and the interlayer insulating layer 240 may include a drain contact hole partially exposing the drain region of the semiconductor pattern 210. The drain electrode 260 may include a region overlapping with the drain region of the semiconductor pattern 210. For example, the drain electrode 260 may be in direct contact with the drain region of the semiconductor pattern 210 in the drain contact hole.

A buffer insulating layer 110 may be disposed between the device substrate 100 and the driving circuit. The buffer insulating layer 110 may prevent the pollution due to the device substrate 110 during a process of forming the thin film transistor 200. For example, the buffer insulating layer 110 may completely cover an upper surface of the device substrate 100 toward the driving circuit. The buffer insulating layer 110 may include an insulating material. For example, the buffer insulating layer 110 may include an inorganic insulating material, such as silicon oxide (SiO) and silicon nitride (SiN).

A lower passivation layer 120 may be disposed on the driving circuit. The lower passivation layer 120 may prevent the damage of the driving circuit due to an external impact and moisture. For example, an upper surface of the thin film transistor 200 opposite to the device substrate 100 may be covered by the lower passivation layer 120. The lower passivation layer 120 may include an insulating material. For example, the lower passivation layer 120 may include an inorganic insulating material, such as silicon oxide (SiO) and silicon nitride (SiN).

An over-coat layer 130 may be disposed on the lower passivation layer 120. The over-coat layer 130 may remove a thickness difference due to the driving circuit. For example, an upper surface of the over-coat layer 130 opposite to the device substrate 100 may be a flat surface. The over-coat layer 130 may include an insulating material. The over-coat layer 130 may include a material different from the lower passivation layer 120. For example, the over-coat layer 130 may include an organic insulating material.

A light-emitting device 300 may be disposed on the over-coat layer 130. The light-emitting device 300 may emit light displaying a specific color. For example, the light-emitting device 300 may include a first electrode 310, a light-emitting layer 320 and a second electrode 330, which are sequentially stacked on the over-coat layer 130.

The first electrode 310 may include a conductive material. The first electrode 310 may have high transmittance. For example, the first electrode 310 may be a transparent electrode mad of a transparent conductive material, such as ITO and IZO. The first electrode 310 may be electrically connected to the thin film transistor 200. For example, the lower passivation layer 120 and the over-coat layer 130 may include an electrode contact hole partially exposing the drain electrode 260 of the thin film transistor 200. The first electrode 310 may include a region overlapping with the drain electrode 260 of the thin film transistor 200. For example, the first electrode 310 may be in direct contact with the drain electrode 260 of the thin film transistor 200 through the electrode contact hole.

The second electrode 330 may include a conductive material. The second electrode 330 may include a material different from the first electrode 310. The second electrode 330 may have a reflectance higher than the first electrode 310. For example, the second electrode 330 may include a metal, such as aluminum (Al) and silver (Ag). Thus, in the display apparatus according to the embodiment of the present disclosure, the light generated by the light-emitting device 300 may be emitted toward the outside of the device substrate 100. The driving circuit may not overlap the light-emitting device 300. For example, the thin film transistor 200 may be disposed outside the light-emitting device 300. Therefore, in the display apparatus according to the embodiment of the present disclosure, the light emitted from the light-emitting device 300 may be not blocked by the driving circuit.

The light-emitting layer 320 may generate light having a luminance corresponding to a voltage different between the first electrode 310 and the second electrode 330. The light-emitting layer 320 may include a plurality of emission material layer (EML). For example, the light-emitting layer 320 may include a first emission stack 321, a charge generation layer 322 and a second emission stack 323, which are sequentially stacked on the first electrode 310. The charge generation layer 322 may supply electrons or holes to the first emission stack 321 and the second emission stack 323. For example, the charge generation layer 322 may have a stacked structure of a n-type charge generating layer **322*a* and a p-type charge generating layer 322*b*. In the display apparatus according to the embodiment of the present disclosure, the first electrode 310 may function as anode and the second electrode 330 may function as cathode. Thus, in the display apparatus according to the embodiment of the present disclosure, the first emission stack 321 may be disposed between the first electrode 310 and the n-type charge generating layer 322*a* of the charge generation layer 322, and the second emission stack 323 may be disposed between the p-type charge generating layer 322*b* of the charge generation layer 320 and the second electrode 330. Therefore, in the display apparatus according to the embodiment of the present disclosure, the electrons and the holes may be evenly supplied to the first emission stack 321 and the second emission stack 323**.

The first emission stack 321 may include a hole injection layer (HIL) **321*a*, a first hole transport layer (HTL) 321*b*, a blue emission material layer 321*c* and a first electron transport layer (ETL) 321*d*, which are sequentially stacked on the first electrode 310. The hole injection layer 321*a* and the first hole transport layer 321*b* may supply the holes to the blue emission material layer 321*c*, smoothly. The first electron transport layer 321*d* may supply the electron to the blue emission material layer 321***c*, smoothly. The blue emission material layer 321*c* may generate the light by the recombination of the holes supplied through the hole injection layer 321*a* and the first hole transport layer 321*b* and the electrons supplied through the first electron transport layer 321*d*. The blue emission material layer 321*c* may emit the light displaying a blue color. For example, the light generated by the blue emission material layer 321*c* may have a peak wavelength of 440 nm to 480 nm. The blue emission material layer 321*c* may include a blue dopant and a host material. The blue dopant may be a fluorescent material. For example, the blue emission material 321*c* may be formed by using at least one selected from the group consisting of an anthracene derivative, a pyrene derivative and perylene derivative as the host material, and being doped with a pyrene-based blue dopant or a boron-based blue dopant.

The second emission stack 323 may include an emission buffer layer 323*a*, a red phosphorescent emission material layer 323*b*, a green phosphorescent emission material layer 323*c*, a second electron transport layer 323*d* and an electron injection layer (EIL) 323*e*. The holes may be supplied to the red phosphorescent emission material layer 323*b* and the green phosphorescent emission material layer 323*c* may be supplied through the emission buffer layer 323*a*. The electrons may be supplied to the red phosphorescent emission material layer 323*b* and the green phosphorescent emission layer 323*c* through the second electron transport layer 323*d* and the electron injection layer 323*e*. Each of the red phosphorescent emission material layer 323*b* and the green phosphorescent emission layer 323*c* may generate the light by the recombination of the holes supplied through the emission buffer layer 323*a* and the electrons supplied through the second electron transport layer 323*d* and the electron injection layer 323*e*. The red phosphorescent emission material layer 323*b* may emit the light displaying a red color. For example, the light generated by the red phosphorescent emission material layer 323*b* may have a peak wavelength of 640 nm to 720. The red phosphorescent emission material layer 323*b* may include a red dopant and a host material. The red dopant may be a phosphorescent material. For example, the red phosphorescent emission material layer 323*b* may be formed by using CBP(carbazole biphenyl) or mCP(1,3-bis(carbazol-9-yl) as the host material, and being doped with a red dopant including at least one selected from the group consisting of Ir(Piq)3(Tris(1-phenylisoquinoline)iridium(III)), Ir(piq)2(acac)(Bis(1-phenylisoquinoline)(acetylacetonate)iridiumIII)), Ir(btp)2(acac)(Bis)2-benzo[b]thiophen-2-yl-pyridine) (acetylacetonate) iridiumIII)), Ir(BT)2(acac)(Bis(2-phenylbenzothazolato) (acetylacetonate) iridiumIII)). The green phosphorescent emission material layer 323*c* may emit the light displaying a green color. For example, the light generated by the green phosphorescent emission material layer 323*c* may have a peak wavelength of 520 nm to 560 nm. The green phosphorescent emission material layer 323*c* may include a green dopant and a host material. The green dopant may be a phosphorescent material. For example, the green phosphorescent emission material layer 323*c* may be formed by using CBP(carbazole biphenyl) or mCP(1,3-bis(carbazol-9-yl) as the host material, and being doped with a green dopant including at least one of Ir(ppy)3(fac tris(2-phenylpyridine) iridium), Ir(ppy)2(acac) and Ir(mpyp)3.

The emission buffer layer 323*a* may be in direct contact with the p-type charge generating layer 322*b* of the charge generation layer 322 and the red phosphorescent emission material layer 323*b*. The emission buffer layer 323*a* may include a host have the electron transporting properties. For example, the host of the emission buffer layer 323*a* having the electron transporting properties may include benzocarbazole, as below. Herein, quinazoline may be connected to a and b. Thus, in the display apparatus according to the embodiment of the present disclosure, the inflow of the holes to the emission buffer layer 323*a* from the p-type charge generating layer may be delayed.

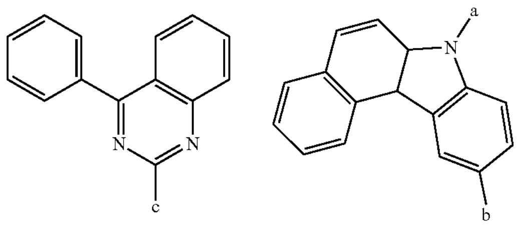

The emission buffer layer 323*a* may include a red dopant. For example, the emission buffer layer 323*a* may be formed by doping the host having electron transporting properties with the red dopant. For example, the red dopant of the emission buffer layer 323*a* may include at least one selected from the group consisting of Ir(Piq)3(Tris(1-phenylisoquinoline)iridium(III)), Ir (piq)2(acac)(Bis(1-phenylisoquinoline) (acetylacetonate) iridiumIII)), Ir (btp)2(acac)(Bis)2-benzo[b]thiophen-2-yl-pyridine) (acetylacetonate) iridiumIII)), Ir(BT)2(acac)(Bis(2-phenylbenzothazolato) (acetylacetonate)iridiumIII)). The red dopant of the emission buffer layer 323*a* may include the same as the red dopant of the red phosphorescent emission material layer 323*b*.

The emission buffer layer 323*a* may have a thickness thinner than the red phosphorescent emission material layer 323*b*. For example, the thickness of the emission buffer layer 323*a* may be 100 Å or less. Thus, in the display apparatus according to the embodiment of the present disclosure, the reduction of the driving voltage according to the rapid movement of the holes introduced from the emission buffer layer 323*a* may be effectively performed.

A below table 1 shows the relative efficiency (R efficiency) of the red phosphorescent emission material layer 323*b*, the relative efficiency (G efficiency) of the green phosphorescence emission material layer 323*c*, the relative efficiency (B efficiency) of the blue emission material layer 321*c*, the driving voltage and the color change rate according to the doping type of the red dopant in the emission buffer layer 323*a* based on the charge generation layer 322.

TABLE 1

| doping type | R efficiency | G efficiency | B efficiency | driving voltage | color change rate CIEx | color change rate CIEy |
|---|---|---|---|---|---|---|
| gradual decrease | 101% | 99% | 101% | 100% | 94% | 103% |
| gradual increase | 116% | 81% | 99% | 110% | 91% | 104% |
| decrease after increase | 108% | 92% | 101% | 106% | 79% | 108% |
| increase after decrease | 112% | 89% | 100% | 103% | 93% | 104% |

Referring to table 1, when the content of the red dopant in the emission buffer layer 323*a* increases as the distance from the charge generation layer 322 increases, the driving voltage greatly increases and the efficiency of the green phosphorescent emission material layer 323*c* greatly decreases. And, if the emission buffer layer 323*a* includes a portion in which the content of the red dopant is increased and a portion in which the content of the red dopant is decreased, the driving voltage is increased and the efficiency of the green phosphorescent emission material layer 323*c* is decreased, compared with a case in which the content of the red dopant in the emission buffer layer 323*a* decreases as the distance from the charge generation layer 322 increases. Thus, in the display apparatus according to the embodiment of the present disclosure, the buffer layer 323*a* between the p-type charge generating layer 322*b* of the charge generation layer 322 and the red phosphorescent emission material layer 323*b* may be formed by doping the host having the electron transporting properties with the red dopant, and the content of the red dopant in the emission buffer layer 323*a* may decrease as the distance from the charge generation layer 322 increases.

A bank insulating layer 140 may be disposed on the over-coat layer 130. The bank insulating layer 140 may include an insulating material. For example, the bank insulating layer 140 may include an organic insulating material. The bank insulating layer 140 may include a material different from the over-coat layer 130. The bank insulating layer 140 may define an emission area on the device substrate 100. For example, the bank insulating layer 140 may cover an edge of the first electrode 310. The light-emitting layer 320 and the second electrode 330 of the light-emitting device 300 may be stacked on a portion of the first electrode 310 exposed by the bank insulating layer 140. Thus, in the display apparatus according to the embodiment of the present disclosure, the light-emitting device 300 may be controlled, independently. The light-emitting layer 320 and the second electrode 330 may extend on the bank insulating layer 140.

An encapsulation element 400 may be disposed on the light-emitting device 300. The encapsulation element 400 may prevent the damage of the light-emitting device 300 due to the external impact and moisture. The encapsulation element 400 may have a multi-layer structure. For example, the encapsulation element 400 may include a first encapsulating layer 410, a second encapsulating layer 420 and a third encapsulating layer 430, which are sequentially stacked. The first encapsulating layer 410, the second encapsulating layer 420 and the third encapsulating layer 430 may include an insulating material. The second encapsulating layer 420 may include a material different from the first encapsulating layer 410 and the third encapsulating layer 430. For example, the first encapsulating layer 410 and the third encapsulating layer 430 may include an inorganic insulating material, and the second encapsulating layer 420 may include an organic insulating material. Thus, in the display apparatus according to the embodiment of the present disclosure, the damage of the light-emitting device 300 due to the external impact and moisture may be effectively prevented. A thickness difference due to the light-emitting device 300 may be removed by the second encapsulating layer 420. For example, an upper surface of the encapsulation element 400 opposite to the device substrate 100 may be a flat surface.

Figure 3:
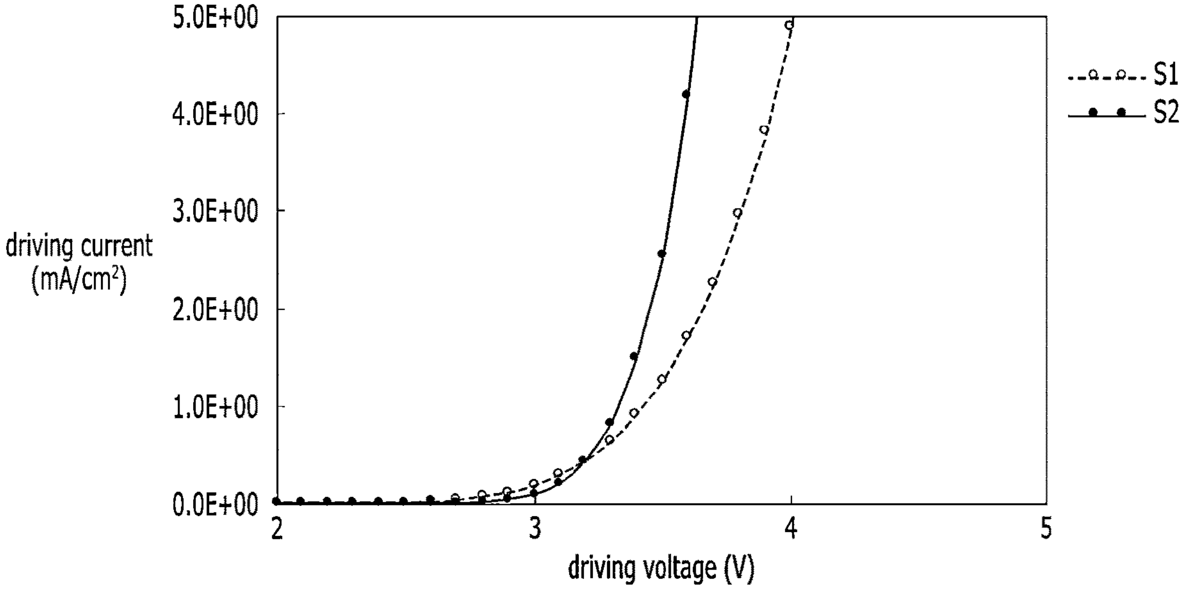
FIG. 3 is a view showing a driving voltage according to the presence or absence of an emission buffer layer in a second emission stack of the display apparatus.

FIG. 3 is a view showing driving voltages of the first display apparatus S1 in which the second emission stack does not include the emission buffer layer and the second display apparatus S2 in which the emission buffer layer is disposed in the second emission stack.

Referring to FIG. 3, in the second display apparatus S2 compared with the first display apparatus S1, the driving voltage is decreased when the light-emitting device 300 is driven. Thus, in the display apparatus according to the embodiment of the present disclosure in which the emission buffer layer 323*a* is disposed between the p-type charge generating layer 322*b* and the red phosphorescent emission material layer 323*b*, although the inflow of the holes is delayed by the host of the emission buffer layer 323*a* having the electron transporting properties, the content of the red dopant may be decreased as the distance from the charge generation layer 322 increases, such that the introduced holes may rapidly move and the driving voltage may be reduced.

Accordingly, the display apparatus according to the embodiment of the present disclosure may include the light-emitting layer 320 between the first electrode 310 and the second electrode 330, wherein the light-emitting layer 320 may include the first emission stack 321 including the blue emission material layer 321*c* and the second emission stack 323 between the first emission stack 321 and the second electrode 330, wherein the second emission stack 323 may have a structure in which the emission buffer layer 323*a* including the host having the electron transporting properties, the red phosphorescent emission material layer 323*b* and the green phosphorescent emission material layer 323*c* are sequentially stacked, and wherein the content of the red dopant in the emission buffer layer 323*a* may increase as the distance from the red phosphorescent emission material layer 323*b* increases. Thus, in the display apparatus according to the embodiment of the present disclosure, although the inflow of the holes into the emission buffer layer 323*a* is delayed, the holes introduced into the emission buffer layer 323*a* may be rapidly moved to the red phosphorescent emission material layer 323*b*. therefore, in the display apparatus according to the embodiment of the present disclosure, the driving voltage may be reduced, and the color change at low-current may be improved.

The emission buffer layer 323*a* may be in direct contact with the p-type charge generating layer 322*b* and the red phosphorescent emission material layer 323*b*. The content of the red dopant in the emission buffer layer 323*a* at a surface of the emission buffer layer 323*a* being in contact with the red phosphorescent emission material layer 323*b* may be the same as the content of the red dopant in the red phosphorescent emission material layer 323*b*. For example, the content of the red dopant in the emission buffer layer 323*a* may gradually increase from the content of the red dopant in the red phosphorescent emission material layer 323*b* as the distance from the red phosphorescent emission material layer 323*b* increase. Thus, in the display apparatus according to the embodiment of the present disclosure, the holes may smoothly move in the interface between the buffer layer 323*a* and the red phosphorescent emission material layer 323*b*. The host of the red phosphorescent emission material layer 323*b* may include the same material as the host of the emission buffer layer 323*a* having the electron transporting properties. Therefore, in the display apparatus according to the embodiment of the present disclosure, the holes introduced into the emission buffer layer 323*a* may effectively move to the red phosphorescent emission material layer 323*b*.

The display apparatus according to the embodiment of the present disclosure is described that the second emission stack 323 includes the red phosphorescent emission material layer 323*b* and the green phosphorescent emission material layer 323*c*. However, in the display apparatus according to another embodiment of the present disclosure, various phosphorescent emission material layers may be disposed on the red phosphorescent emission material layer of the second emission stack. For example, in the display apparatus according to another embodiment of the present disclosure, the second emission stack may include the emission buffer layer, the red phosphorescent emission material layer, a yellow-green phosphorescent emission material layer and the second electron transport layer, which are sequentially stacked on the charge generation layer. That is, in the display apparatus according to another embodiment of the present disclosure, the second emission stack may include the emission buffer layer between the charge generation layer and a first phosphorescent emission material layer and a second phosphorescent emission material layer between the first phosphorescent emission material layer and the second electron transport layer, the emission buffer layer and the first phosphorescent emission material layer may include the red dopant, the emission buffer layer include the host having the electron transporting properties, the content of the red dopant in the emission buffer layer may be decreased as the distance from the charge generation layer increase. Thus, in the display apparatus according to another embodiment of the present disclosure, the driving voltage may be reduced and the color change at low-current may be improved, regardless of the material of the second phosphorescent emission material layer on the first phosphorescent emission material layer including the red dopant.

Figure 4:
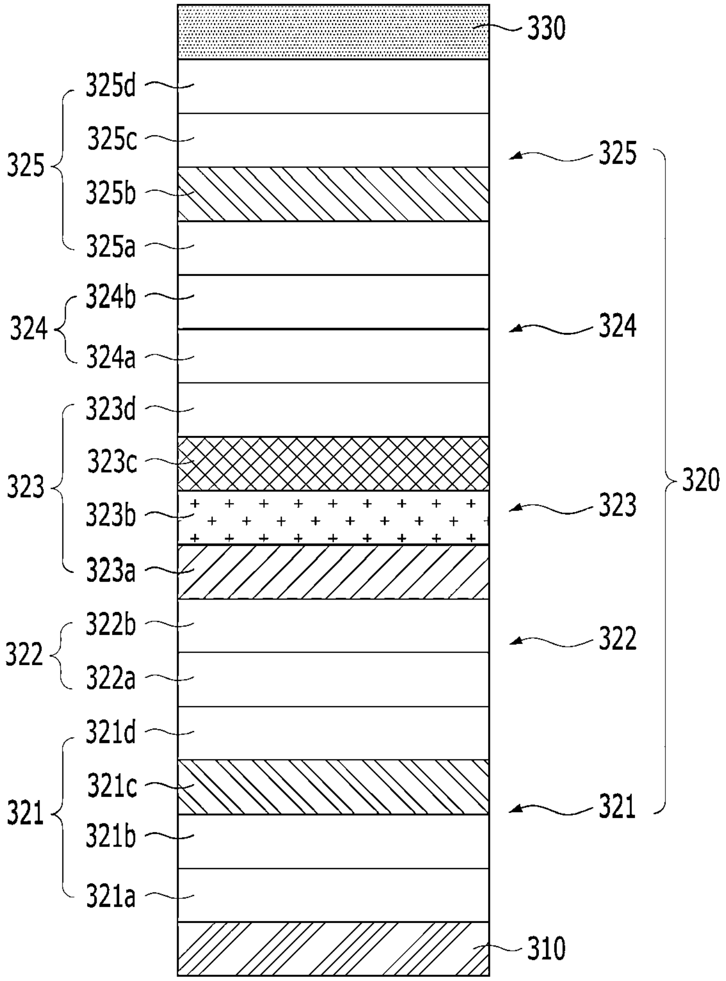
FIG. 4 is a view showing the display apparatus according to another embodiment of the present disclosure.

The display apparatus according to the embodiment of the present disclosure is described that the light-emitting layer 320 is composed of the first emission stack 321 and the second emission stack 323. However, in the display apparatus according to another embodiment of the present disclosure, the light-emitting layer 320 may include a plurality of charge generation layers. For example, in the display apparatus according to another embodiment of the present disclosure, the light-emitting layer 320 between the first electrode 310 and the second electrode 330 may include the first emission stack 321, a first charge generation layer 322, the second emission stack 323, a second charge generation layer 324 and a third emission stack 325, which are sequentially stacked. The first emission stack 321 may include the hole injection layer 321*a*, the first hole transport layer 321*b*, the blue emission material layer 321*c* and the first electron transport layer 321*d*, which are sequentially stacked. The second emission stack 323 may include the emission buffer layer 323*a*, the red phosphorescent emission material layer 323*b*, the green phosphorescent emission material layer 323*c* and the second electron transport layer 323*d*, which are sequentially stacked. The third emission stack 325 may include a third hole transport layer 325*a*, a blue emission material layer 325*b*, a third electron transport layer 325*c* and the electron injection layer 325*d*, which are sequentially stacked, as shown in FIG. 4. Thus, in the display apparatus according to another embodiment of the present disclosure, the blue emission efficiency having relatively low may be compensated. For example, the blue emission material layer 325*b* of the third emission stack 325 may include the same material as the blue emission material layer 321*c* of the first emission stack 321.

The second charge generation layer 324 between the second emission stack 323 and the third emission stack 325 may have the same structure as the first charge generation layer 322 between the first emission stack 321 and the second emission stack 323. For example, the second charge generation layer 324 may have a stacked structure of the n-type charge generating layer 324*a* and the p-type charge generating layer 324*b*. The second emission stack 323 may be disposed between the p-type charge generating layer 322*b* of the first charge generation layer 322 and the n-type charge generating layer 324*a* of the second charge generation layer 324. The third emission stack 325 may be disposed between the p-type generating layer 324*b* of the second charge generation layer 324 and the second electrode 330. Thus, the display apparatus according to another embodiment of the present disclosure may compensate the blue efficiency by the third emission stack 325, may reduce the driving voltage using the emission buffer layer 323*d* and may improve the change color in low-current.

In the result, the display apparatus according to the embodiments of the present disclosure may include the light-emitting layer between the first electrode and the second electrode, wherein the light-emitting layer may include the first emission stack including the blue emission material layer and the second emission stack on the first emission stack, wherein the second emission stack may include the first red phosphorescent emission material layer and the second phosphorescent emission material layer, which are sequentially stacked on the emission buffer layer including the host having the electron transporting properties, wherein the emission buffer layer and the first phosphorescent emission material layer may include the red dopant, and wherein the content of the red dopant in the emission buffer layer may decrease as the distance from the charge generation layer between the first emission stack and the second emission stack increases. Thus, in the display apparatus according to the embodiments of the present disclosure, although the inflow of the holes into the emission buffer layer is delayed, the holes introduced into the emission buffer layer may rapidly move to the first phosphorescent emission material layer. Thereby, in the display apparatus according to the embodiments of the present disclosure, the driving voltage may be reduced, and the color change at low-current may be improved.

It will be apparent to those skilled in the art that various modifications and variations can be made in the display apparatus of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display apparatus comprising:

an anode;

a cathode on the anode;

a first charge generation layer between the anode and the cathode;

a first emission stack between the anode and the first charge generation layer, the first emission stack including a blue emission material layer; and a second emission stack between the first charge generation layer and the cathode, wherein the second emission stack includes an emission buffer layer, a first phosphorescent emission material layer and a second phosphorescent emission material layer, which are sequentially stacked, wherein the emission buffer layer is disposed between the first charge generation layer and the first phosphorescent emission material layer, wherein the emission buffer layer includes a host having an electron transporting properties, wherein the emission buffer layer and the first phosphorescent emission material layer include a red dopant, wherein a content of the red dopant in the emission buffer layer decreases as a distance from the first charge generation layer increases such that a content of the red dopant in a portion of the emission buffer layer disposed close to the first charge generation layer is larger than a content of the red dopant in a portion of the emission buffer layer disposed close to the first phosphorescent emission material layer, and wherein the content of the red dopant in a portion of the emission buffer layer disposed close to the first charge generation layer is larger than a content of the red dopant in the first phosphorescent emission material layer.

2. The display apparatus according to claim 1, wherein the first charge generation layer includes a n-type charge generating layer disposed close to the first emission stack and a p-type charge generating layer on the n-type charge generating layer, and wherein the emission buffer layer is in contact with the p-type charge generating layer and the first phosphorescent emission material layer.

3. The display apparatus according to claim 1, wherein the red dopant of the emission buffer layer includes a phosphorescent material.

4. The display apparatus according to claim 3, wherein the red dopant of the first phosphorescent emission material layer includes a same material as the red dopant of the emission buffer layer.

5. The display apparatus according to claim 4, wherein the content of the red dopant in the emission buffer layer decreases such that the content of the red dopant in the emission buffer layer at a surface of the emission buffer layer in contact with the first phosphorescent emission material layer is a same content as a content of the red dopant in the first phosphorescent emission material layer.

6. The display apparatus according to claim 4, wherein a host of the first phosphorescent emission material layer includes a same material as the host of the emission buffer layer having the electron transporting properties.

7. The display apparatus according to claim 1, the host having the electron transporting properties includes benzo-carbazole.

8. The display apparatus according to claim 1, further comprising:

a third emission stack between the second emission stack and the cathode; and a second charge generation layer between the second emission stack and the third emission stack, wherein the third emission stack includes a blue emission material layer.

9. The display apparatus according to claim 8, wherein the blue emission material layer of the third emission stack includes a same material as the blue emission material layer of the first emission stack.

10. The display apparatus according to claim 1, wherein the content of the red dopant in the emission buffer layer decreases such that the content of the red dopant in the emission buffer layer at a surface of the emission buffer layer in contact with the first phosphorescent emission material layer is a same content as a content of the red dopant in the first phosphorescent emission material layer.

11. The display apparatus according to claim 10, wherein the emission buffer layer is in direct contact with the p-type charge generating layer of the first charge generation layer and in direct contact with the first phosphorescent emission material layer.

12. The display apparatus according to claim 1, wherein the emission buffer layer has a thickness thinner than the first phosphorescent emission material layer.

13. The display apparatus according to claim 12, wherein the thickness of the emission buffer layer is 100 Å or less.

14. The display apparatus according to claim 1, the emission buffer layer includes:

a host having benzo-carbazole; and a dopant having at least one of Ir(Piq)3(Tris(1 phenylisoquinoline)iridium (III)), Ir(piq)2(acac)(Bis(1 phenylisoquinoline)(acetylacetonate)iridiumIII)), Ir(btp)2 (acac)(Bis)2 benzo[b]thiophen-2-yl-pyridine) (acetylacetonate)iridiumIII)), and Ir(BT)2(acac) (Bis (2-phenylbenzothazolato)(acetylacetonate)iridiumIII)).

* * * * *